US005600238A

United States Patent [19]
Holloway et al.

[11] Patent Number: 5,600,238
[45] Date of Patent: Feb. 4, 1997

[54] METHOD AND APPARATUS FOR DETECTING THE LINEAR OR ROTARY POSITION OF AN OBJECT THROUGH THE USE OF A VARIABLE MAGNETIC SHUNT DISPOSED IN PARALLEL WITH A YOKE AIR GAP

[75] Inventors: Henry Holloway, Dearborn; David J. Kubinski, Canton, both of Mich.

[73] Assignee: Ford Motor Company, Dearborn, Mich.

[21] Appl. No.: 270,562

[22] Filed: Jul. 5, 1994

[51] Int. Cl.⁶ .......................... G01B 7/14; G01B 7/30
[52] U.S. Cl. .......................... 324/207.21; 324/207.23; 324/207.24; 324/207.25; 338/32 R
[58] Field of Search .................. 324/207.2, 207.21, 324/251, 252, 207.24, 207.25, 207.26, 173–176; 338/32 R, 32 H

[56] References Cited

U.S. PATENT DOCUMENTS

| | | | |
|---|---|---|---|
| 3,226,631 | 12/1965 | Kuhrt et al. | 324/207.2 |
| 3,777,273 | 12/1973 | Baba et al. | 324/207.21 |
| 4,480,248 | 10/1984 | Sudo et al. | 338/32 R |
| 4,506,220 | 3/1985 | Sawada et al. | 324/252 |
| 4,754,221 | 6/1988 | Ao et al. | 324/207.21 |
| 4,810,965 | 3/1989 | Fujiwara et al. | 324/207.21 |
| 5,164,668 | 11/1992 | Alfors | 324/207.2 |
| 5,313,186 | 5/1994 | Schuhl et al. | 324/252 X |
| 5,373,238 | 12/1994 | McGuire et al. | 324/252 |

FOREIGN PATENT DOCUMENTS

| | | | |
|---|---|---|---|
| 0584426 | 3/1994 | European Pat. Off. | 324/207.2 |
| 2647818 | 4/1978 | Germany | 324/207.2 |
| 0060157 | 5/1977 | Japan | 324/207.2 |
| 0133367 | 10/1979 | Japan | 324/207.2 |
| 0497524 | 12/1975 | U.S.S.R. | 324/207.2 |
| 0510645 | 4/1976 | U.S.S.R. | 324/207.21 |
| 0734574 | 5/1980 | U.S.S.R. | 324/207.2 |

*Primary Examiner*—Sandra L. O'Shea
*Assistant Examiner*—Jay M. Patidar
*Attorney, Agent, or Firm*—Allan J. Lippa; Roger L. May

[57] ABSTRACT

A position detecting apparatus includes a permanent magnet which is operative to generate a magnetic field and a yoke which is provided in electromagnetic communication with the permanent magnet for guiding at least a portion of the magnetic field therethrough. The yoke includes a high-permeability magnetic material and has an air gap of pre-determined lateral dimension. A variable magnetic shunt is affixed to an object whose position is sought to be detected. The magnetic field in the air gap is perturbed by the movement of the shunt causing a change in intensity measurable by a magnetoresistive sensor. The sensor generates an electrical signal which corresponds to the determined intensity of the magnetic field and to the angular/linear position of the variable shunt and the attached object.

12 Claims, 4 Drawing Sheets

5,600,238

METHOD AND APPARATUS FOR DETECTING THE LINEAR OR ROTARY POSITION OF AN OBJECT THROUGH THE USE OF A VARIABLE MAGNETIC SHUNT DISPOSED IN PARALLEL WITH A YOKE AIR GAP

TECHNICAL FIELD

The present invention relates generally to contactless position detection systems and, more particularly, to an apparatus and method for determining the linear or rotary position of an object through the use of a magnetoresistive sensor.

BACKGROUND ART

Various types of non-contact distance measuring devices are presently available for measuring linear and angular displacement and detecting absolute position of an object in linear or angular systems. A classic example is a sliding resistor potentiometer which, as known to those skilled in the art, is generally unreliable. Optical position devices are also available which utilize optical sensors to provide an optical scale such as a slit scale. While generally more reliable than the aforementioned resistor potentiometer instruments, optical position devices nonetheless require complicated construction and are thus expensive to manufacture and are somewhat difficult to use. They are also very sensitive to dirt and other contaminants and have been found in practice very difficult to keep clean.

There are also available magnetic scales wherein a scale written into a magnetic medium is read out by a magnetic sensor. Again, however, these devices require fairly complicated structure and are thus expensive to manufacture and difficult to use. Moreover, these magnetic scales are incapable of measuring absolute position. As those skilled in the art will recognize, such devices are only operative to determine the distance between two arbitrary points.

One attempt to overcome the aforementioned difficulties associated with the prior art devices is disclosed in U.S. Pat. No. 4,810,965 issued to Fujiwara et al. and entitled "Position Detecting Apparatus Using A Magnetic Sensor And A Closed Magnetic Circuit With Non-Uniform Magnetic Flux Distribution". The '965 patent is assigned to Fujitsu, Ltd., Kawasaki, Japan. Fujiwara discloses a magnetic closed circuit having many magnetic and mechanical configurations directed to sensing linear or angular displacement of a desired object. In operation, the device disclosed by Fujiwara sets up a magnetic circuit which gives a magnetic field whose intensity depends upon position. Properties of the circuit, however, do not vary. As shown, the magnetic field sensor is attached to the part whose position is sought to be determined and is also in the spatially varying magnetic field. Thus, changing the sensor's position changes the field to which it is exposed.

Consequently, a need has developed for an improved contactless position detecting apparatus and method. Such an apparatus and method should permit the angular or linear position of a desired object to be determined with high reliability and should further be relatively inexpensive to manufacture and use compared to prior art devices.

DISCLOSURE OF THE INVENTION

It is an object of the present invention to provide a contactless position detecting apparatus and method for determining the angular or linear position of a desired object through the use of a magnetoresistive sensor.

Yet another object of the present invention is the provision of an apparatus and method for detecting the position of an object, as above, which utilizes a magnetoresistive sensor comprised of alternating layers of non-ferromagnetic metal and ferromagnetic metal.

Yet another object of the present invention is the provision of a position detecting apparatus and method as above which utilizes a variable magnetic shunt whose linear or rotary position affects the magnetic field that is generated in a yoke gap by a permanent magnet.

In carrying out the above stated objects and other objects, features and advantages of the present invention, there is provided a position detecting apparatus having a permanent magnet which is operative to generate a magnetic field. A yoke is provided in electromagnetic communication with the permanent magnet for guiding at least a portion of the magnetic field therethrough. As discussed herein, the yoke includes a high-permeability magnetic material such as, for example, iron or iron-nickel alloys and has an air gap of predetermined lateral dimension. A variable magnetic shunt operative to perturb the magnetic field generated in the yoke gap by the permanent magnet is also provided in accordance with the present invention. The magnetic shunt is affixed to the object whose position is sought to be detected. Like the yoke, the variable magnetic shunt is comprised of a high-permeability magnetic material such as iron or iron-nickel alloys.

In order to determine the angular or linear position of the desired object, a magnetoresistive sensor is disposed in the yoke gap for determining the intensity of the magnetic field therein. In the preferred embodiment, the magnetoresistive sensor is comprised of alternating layers of non-ferromagnetic metal and ferromagnetic metal and is operative to generate an electrical signal corresponding to the determined magnetic field intensity in the yoke gap. The magnetic field in the yoke gap depends on the angular/linear position of the variable shunt.

In further carrying out the above-stated objects and other objects, features and advantages of the present invention, there is similarly provided a method for detecting the position of an object. The method includes the provision of a permanent magnet which is operative to generate a magnetic field. A yoke is also provided which is in electrical communication with the permanent magnet for guiding at least a portion of the magnetic field therethrough. As referenced above, in the preferred embodiment, the yoke includes a soft, high-permeability magnetic material such as iron or iron-nickel alloys and includes an air gap of predetermined lateral dimension.

In operation, the magnetic field generated in the yoke gap is perturbed through the use of a variable magnetic shunt which is affixed to the object whose position is sought to be detected. Again, in the preferred embodiment, the variable magnetic shunt comprises a high-permeability magnetic material such as iron or iron-nickel alloys. The intensity of the magnetic field in the yoke gap is determined through the use of a magnetoresistive sensor disposed in the yoke gap. Also in the preferred embodiment, the magnetoresistive sensor is comprised of alternating layers of non-ferromagnetic metal and ferromagnetic metal. Finally, an electrical signal may be generated corresponding to the determined magnetic field intensity and the angular/linear position of the variable shunt.

The above objects and other objects, features, and advantages of the present invention are readily apparent from the following detailed description of the best modes for carrying out the invention when taken in connection with the accompanying drawings wherein like reference numerals correspond to like components.

BEST MODES FOR CARRYING OUT THE INVENTION

Figure 1:
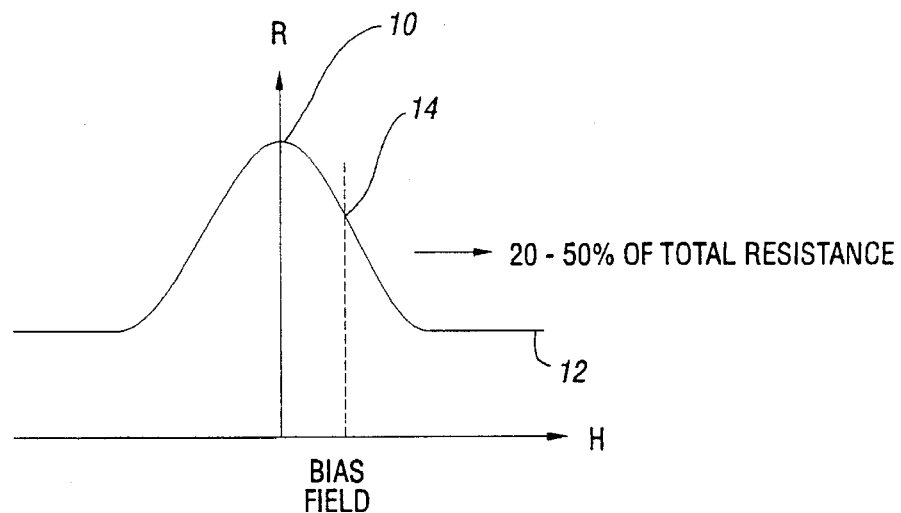
FIG. 1 is a schematic diagram generally illustrating the phenomenon of Giant Magnetoresistance.

As shown in FIG. 1 and known to those of skill in the art, Giant Magnetoresistance (GMR) is a phenomenon that is obtained with structures that consist of alternating thin layers (on the order to ten angstroms) of a non-ferromagnetic metal and ferromagnetic metal. Typical examples are alternating layers comprised of chromium/iron and copper/cobalt. As shown, it has been found that the application of a magnetic field (H) causes a large decrease in the electrical resistance (R) of a Giant Magnetoresistive structure. Indeed, the magnetic field that is required to switch from the high-resistance state shown at 10 to the low resistance state shown at 12 can range from several thousand Gauss down to a few hundred Gauss, depending on the material used and the thickness of the alternating non-ferromagnetic metal and ferromagnetic metal layers. The general form of the resistance/magnetic field curve shown in FIG. 1 illustrates, for example, that a decrease of 20–50% of the total resistance may be obtained depending upon the material.

With this understanding that the resistance in a Giant Magnetoresistive component is a symmetric function of magnetic field, applicants have found it desirable to restrict the operation of the present invention to either positive or negative magnetic field in order for the resistance to be a single-valed function of the position variable that perturbs the magnetic field. In operation, the invention which is more particularly described below will thus operate on either side of a predetermined bias point 14.

Figure 2:
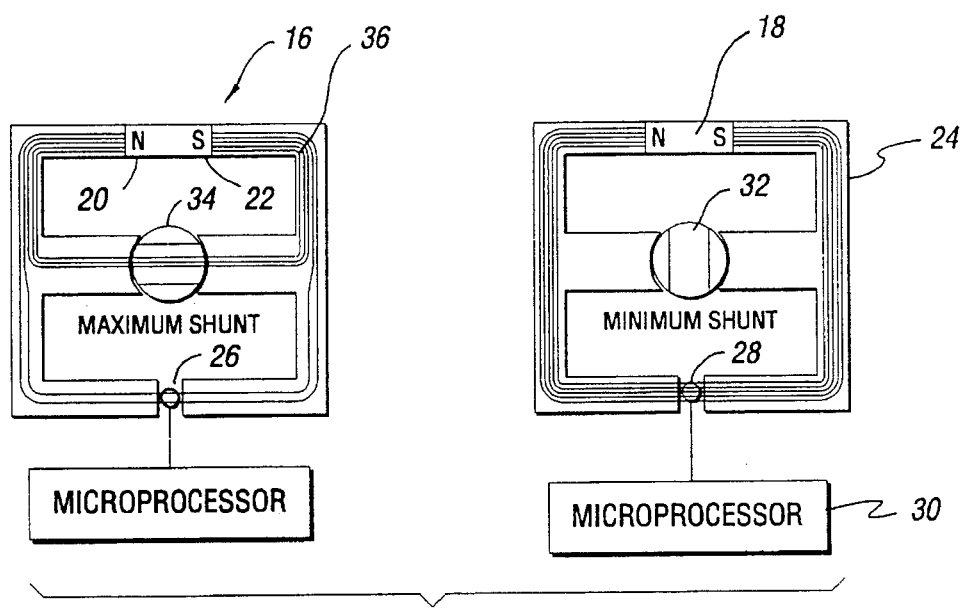
FIG. 2 is a schematic diagram illustrating one embodiment of the present invention.

Referring now to FIG. 2 of the drawings, a first embodiment of the position detecting apparatus of the present invention is shown and referred to generally by reference numeral 16. Magnetic circuit 16 includes a permanent magnet 18 having corresponding North and South poles 20 and 22 having equal strength. Permanent magnet 18 is operative to generate a magnetic field in yoke 24. Yoke 24 includes a high-permeability magnetic material such as, for example, iron or iron nickel alloys and further includes an air gap 26 of predetermined lateral dimension generally on the order of 1–20 mm. A Giant Magnetoresistive sensor 28 is further shown disposed in yoke gap 26 and is operative to sense the intensity of the magnetic field which bridges the gap.

GMR sensor 28 is provided in electrical communication with corresponding circuitry such as microprocessor 30 which is operative to generate an electrical signal corresponding to the detected magnetic field intensity in yoke gap 26. In keeping with the invention, the electrical connection is to a circuit whose output depends upon the resistance measured in sensor 28. In accordance with the invention, a current could also be applied and a voltage measured (or vice versa). Alternatively, sensor 28 could be made one arm of a Wheatstone bridge or other suitable circuit.

As further shown in FIG. 2, there is provided a variable magnetic shunt 32 which is rotated to perturb the magnetic field generated by permanent magnet 18 in the part of the yoke 24 that leads to the yoke gap 26. Variable magnetic shunt 32, like yoke 24, is also comprised of a high-permeability magnetic material such as, for example, iron or iron nickel alloys. Significantly, shunt 32 is affixed to the object whose angular position is sought to be determined. As shown in FIG. 2, in a preferred embodiment, variable shunt 32 may also be embedded in a plastic or other suitable casing 34 so as to restrict its rotary motion to a specified angular range about a specified axis.

In operation, the magnetic field generated by permanent magnet 18 through yoke gap 26 depends on the angular position of variable magnetic shunt 32. As those skilled in the art will recognize, there are flux lines 36 coming out of permanent magnet 18 which become concentrated in the high-permeability magnetic material of yoke 26 and bridge the yoke gap 26. Shunt 32 drains off some of these flux lines 36 by providing an easier path since high-permeability magnetic material is a much easier path for flux to pass through than air. This, in turn, reduces the magnetic field at yoke gap 26, resulting in fewer flux lines.

As readily seen, by changing the angular position of the variable magnetic shunt 32 (from maximum shunt to minimum shunt) which is the flux 36, i.e. the magnetic field in yoke gap 26 will vary accordingly and provide information regarding the angular position of the object whose position is sought to be determined.

Figure 3:
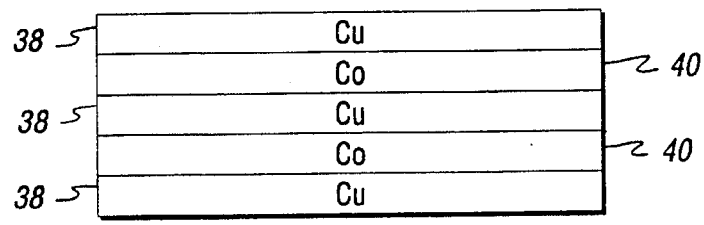
FIG. 3 is a schematic cross-section of a Giant Magnetoresistive sensor used in one embodiment of the present invention.
Figure 4:
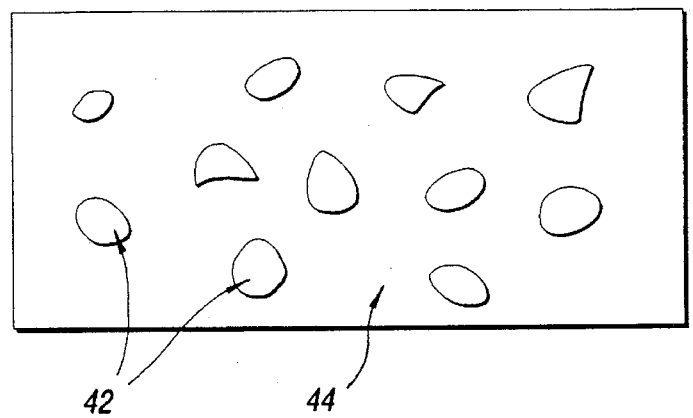
FIG. 4 is a schematic diagram of an alternative embodiment of the Giant Magnetoresistive sensor used in accordance with the present invention.

Referring now to FIGS. 3–4, it is understood that the Giant Magnetoresistive sensor 32 is comprised of alternating layers of ferromagnetic metal 38 selected from the group consisting of cobalt, iron, nickel and alloys with each other or other metals, and non-ferromagnetic metal 40 such as copper, silver or chromium and alloys with each other or other metals. Alternatively, and as shown in FIG. 4, the Giant Magnetoresistive sensor may be comprised of small grains of ferromagnetic material 42 with a diameter on the order of 10–100 angstroms in a non-ferromagnetic matrix 44 with a thickness of the order of 1000 angstroms. Again, the grains of ferromagnetic material may be selected from the group consisting of cobalt, iron and nickel and alloys with each other or other metals. Similarly, the non-ferromagnetic matrix may be comprised of copper or silver.

Figure 5:
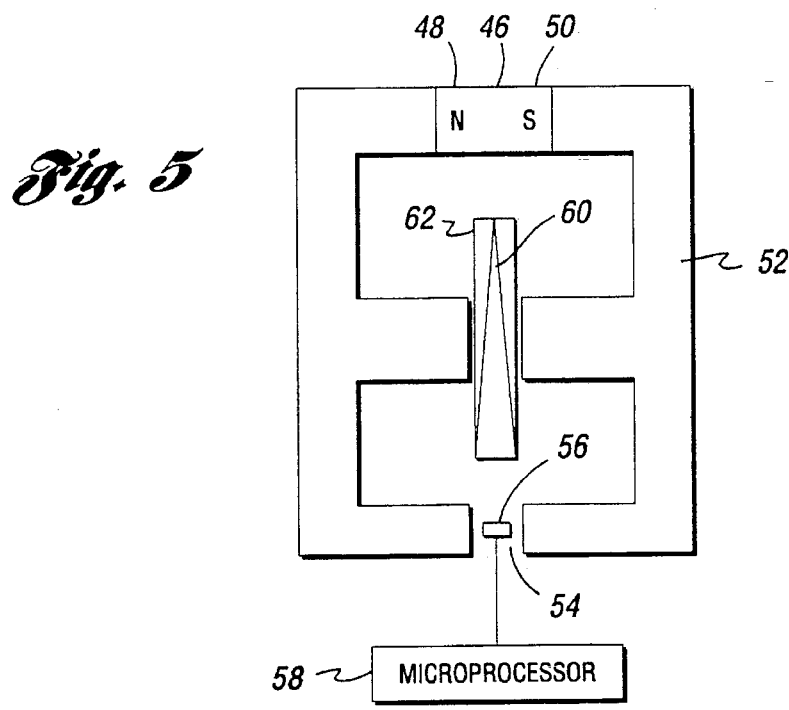
FIG. 5 is a schematic diagram illustrating an alternative embodiment of the present invention.
Figure 8:
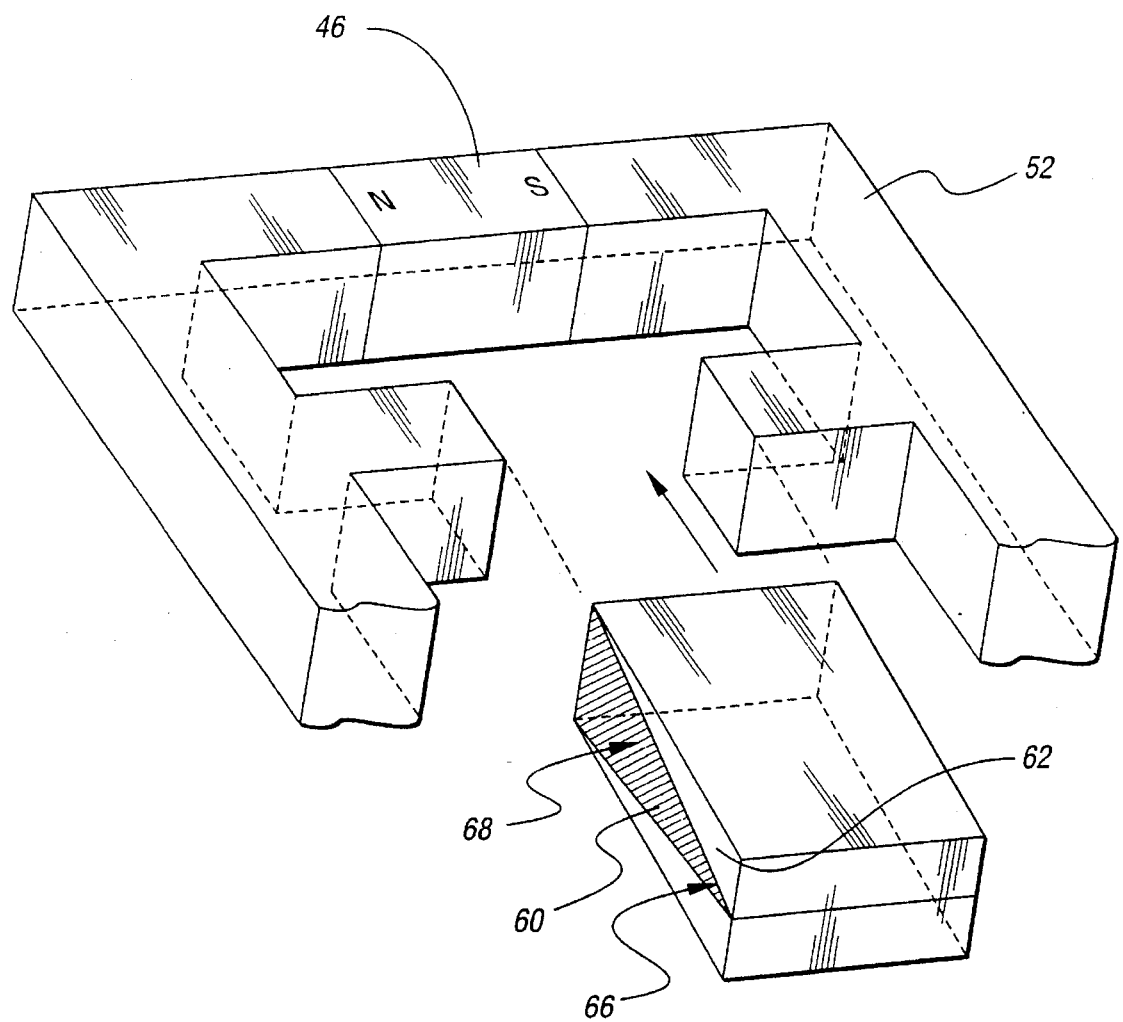
FIG. 8 is a perspective view of the alternative embodiment of FIG. 5.

Referring now to FIGS. 5 and 8 of the invention, an alternative embodiment is shown wherein the linear position of an object may be detected. Like the apparatus of FIG. 1, there is provided a permanent magnet 46 having North and South poles 48 and 50 of equal strength which are operative to generate a magnetic field in yoke 52. Again, yoke 52 guides at least a portion of the magnetic field to yoke gap 54 which is of a predetermined lateral dimension on the order of 1–20 mm.

As in the first embodiment, yoke 52 includes a high-permeability magnetic material such as, for example, iron or iron nickel alloys. A Giant Magnetoresistive sensor 56 is also provided and disposed in yoke gap 54 for determining the intensity of the magnetic field therein and for generating in cooperation with appropriate circuitry such as microprocessor 58, an electrical signal corresponding to the determined magnetic field intensity. Sensor 56 is similarly comprised of alternating layers of ferromagnetic metal such as copper, silver or chromium and non-ferromagnetic metal are selected from the group consisting of cobalt, iron, nickel and alloys with each other or other metals as shown, for example, in the schematic of FIG. 3. Alternatively, as also shown above in FIG. 4, sensor 56 may similarly be comprised of small grains of ferromagnetic material 42 with diameter on the order of 10 angstroms in a non-ferromagnetic matrix with thickness of the order of 1000 angstroms. Again, and as referenced above, the grains of ferromagnetic material may be selected from the group consisting of cobalt, iron and nickel and alloys with each other or other metals. Similarly, the non-ferromagnetic matrix may be comprised of copper or silver.

Still referring to FIGS. 5 and 8 of the drawings, a variable magnetic shunt 60 is also provided as in the first embodiment and is operative to perturb the magnetic field generated in yoke gap 54 by permanent magnet 46. Variable magnetic shunt 60 is similarly comprised of a high-permeability magnetic material such as iron or iron-nickel alloys and is affixed to an object whose position is sought to be detected. In contrast to the first embodiment, however, linear and/or rotary motion of the magnetic shunt 60 may perturb the magnetic field in the yoke gap 54. In a preferred embodiment, variable magnetic shunt 60 may also be embedded in plastic or other suitable casing 62 so as to restrict its motion to a specified linear or rotary range.

Figure 6:
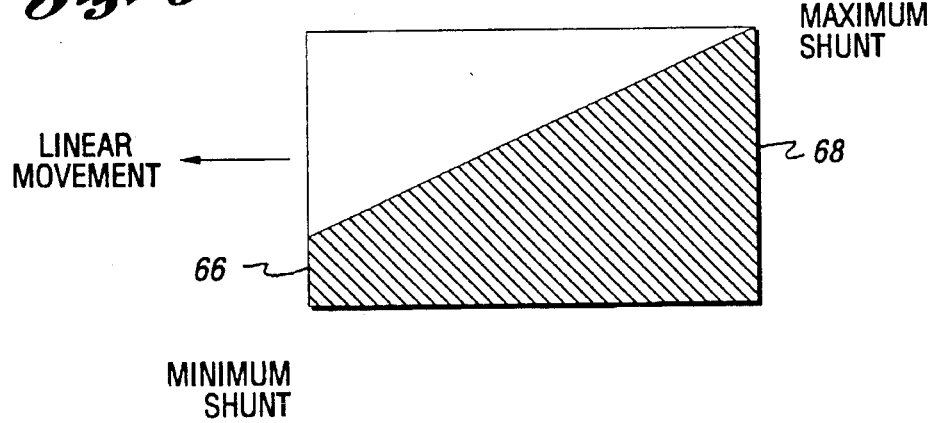
FIG. 6 is a schematic cross-sectional view of the variable magnetic shunt used in the alternative embodiment of FIG. 5 in accordance with the present invention.

The embodiment of FIG. 5 operates in like manner to that of the first embodiment in that linear movement of variable magnetic shunt 60 within yoke 52 drains off some of the flux lines 64 coming out of permanent magnetic 46 and thus reduces the magnetic field at yoke gap 54. As shown in FIG. 6, linear movement of variable magnetic shunt 60 gradually increases from minimal shunt 66 to maximum shunt 68 as the cross-sectional area of the high permeability magnetic material i.e., the path correspondingly increases. In both embodiments, the yoke thus provides two flux paths (1) one through the yoke gap that contains the giant magnetoresistive sensor; and (2) a second path through the variable magnetic shunt whose value depends on the position being sensed.

Figure 7:
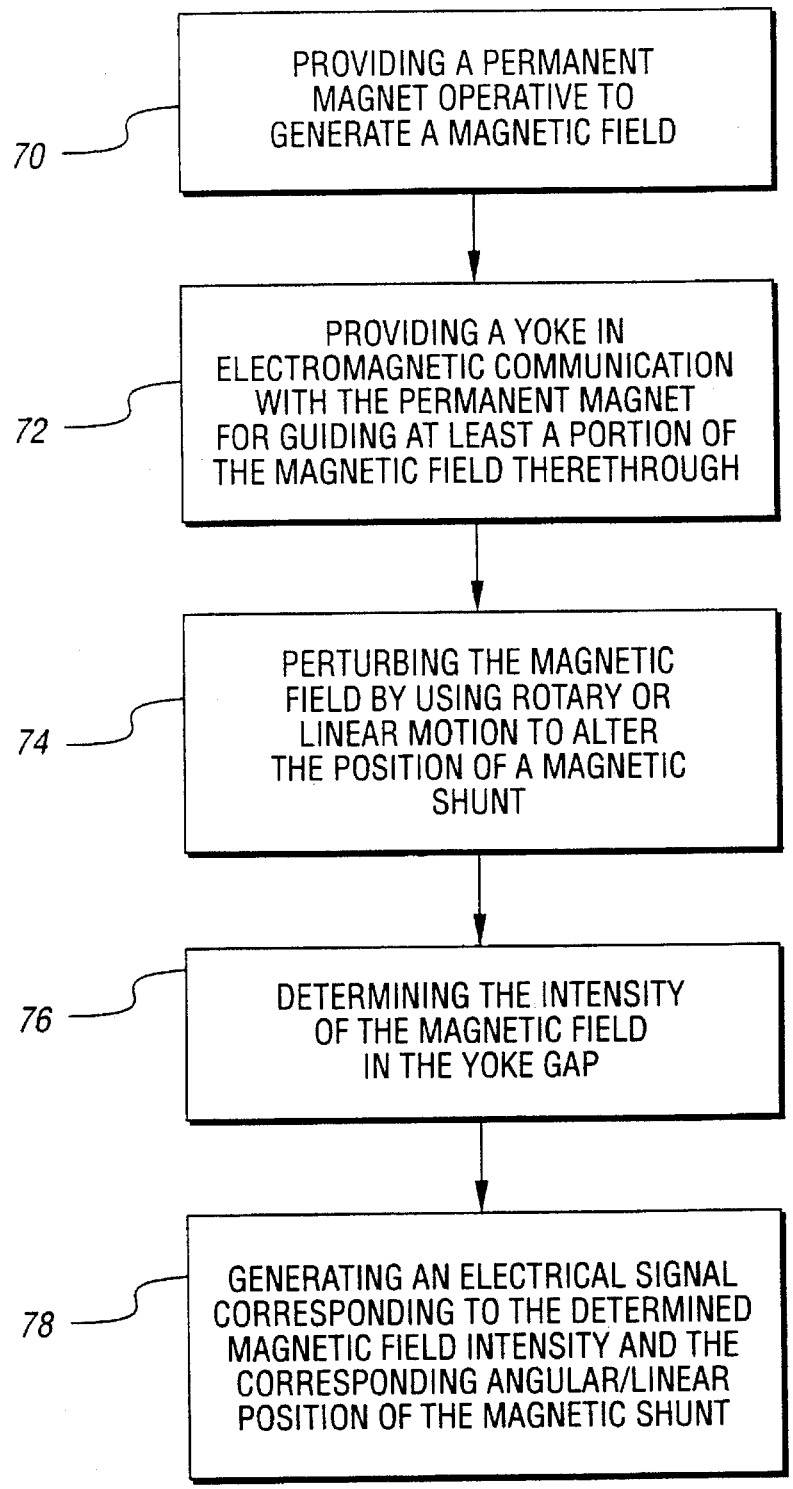
FIG. 7 is a block diagram of the method steps of the present invention.

With reference now to FIG. 7 of the drawings, the method of position detection of the present invention will now be described in further detail. As shown, the method includes the steps of providing (70) a permanent magnetic operative to generate a magnetic field. The method further requires that a yoke be provided (72) in electromagnetic communication with the permanent magnet for guiding at least a portion of the magnetic field therethrough. As referenced above, the yoke includes a high-permeability magnetic material and includes an air gap of predetermined lateral dimension on the order of 1–20 mm. The method further requires that the magnetic field generated in the yoke be perturbed (74) by rotation or linear motion of a variable magnetic shunt.

As referenced above, the variable magnetic shunt is comprised of a high-permeability magnetic material which is preferably iron or iron-nickel alloys. In operation, by determining (76) the intensity of the magnetic field in the yoke gap through the use of a Magnetoresistive sensor which is disposed in the yoke gap, an electrical signal may be generated (78) corresponding to the determined magnetic field intensity and thus the angular/linear position of the variable shunt.

While the best modes for carrying out the invention have been described in detail, those familiar with the art to which this invention relates will recognize various alternative designs and embodiments for practicing the invention as defined by the following claims.

We claim:

1. A rotary position detecting apparatus comprising:

a permanent magnet operative to generate a magnetic field;

a yoke having a first gap provided in electromagnetic communication with said permanent magnet for guiding at least a portion of said magnetic field therethrough, said yoke including a high-permeability magnetic material and having an air gap of predetermined lateral dimension;

a variable magnetic shunt disposed the first gap which is in parallel with the air gap and operative to rotate therein so as to perturb said magnetic field, said shunt comprised of a high-permeability magnetic material and affixed to an object whose position is sought to be detected; and a magneto-resistive sensor disposed in said yoke air gap for determining the intensity of said magnetic field therein and for generating an electrical signal corresponding thereto, whereby the magnetic field in said yoke air gap corresponds to the angular position of said variable shunt.

2. The position detecting apparatus of claim 1, wherein said magneto-resistive sensor is comprised of alternating layers of non-ferromagnetic metal and ferromagnetic metal.

3. The position detecting apparatus of claim 1, wherein said magneto-resistive sensor is comprised of small grains of ferromagnetic material in a non-ferromagnetic matrix.

4. The position detecting apparatus of claim 3, wherein said grains of ferromagnetic material are in a range of 10 angstroms to 1000 angstroms.

5. A method for detecting the linear and rotary position of an object, comprising:

providing a permanent magnet operative to generate a magnetic field;

providing a yoke having a first gap in electromagnetic communication with said permanent magnet for guiding at least a portion of said magnetic field therethrough, said yoke including a high-permeability magnetic material and having an air gap of predetermined lateral dimension;

perturbing said magnetic field generated in said yoke air gap through the use of a variable magnetic shunt which is disposed in the first gap which is parallel to the air gap and is affixed to the object whose position is sought to be detected, said shunt comprised of a high-permeability magnetic material;

determining the intensity of said magnetic field in said yoke air gap through the use of a magneto-resistive sensor disposed in said yoke air gap; and generating an electrical signal corresponding to said determined magnetic field intensity and the angular/linear position of said variable magnetic shunt.

6. The method of claim 5, wherein said magneto-resistive sensor is comprised of alternating layers of non-ferromagnetic metal and ferromagnetic metal.

7. The method of claim 6, wherein said alternating layers of non-ferromagnetic metal and ferromagnetic metal comprise chromium and iron, respectively.

8. The method of claims 5, wherein rotation of said variable shunt perturbs said magnetic field generated in said yoke gap by said permanent magnet.

9. The method of claim 5, wherein linear motion of said variable shunt perturbs said magnetic field generated in said yoke gap by said permanent magnet.

10. The method of claim 5, wherein said magneto-resistive sensor is comprised of small grains of ferromagnetic material in a non-ferromagnetic matrix.

11. The method of claim 10, wherein said grains of ferromagnetic material are in a range of 10 angstroms to 1000 angstroms.

12. A linear and rotary position detecting apparatus, comprising:

a permanent magnet operative to generate a magnetic field;

a yoke for guiding at least a portion of the magnetic flux therethrough, the yoke comprising a high permeability magnetic material and having a pair of substantially vertical members disposed in spaced relationship to one another, each of the vertical members having a substantially horizontal first finger disposed in faced relationship with one another, a substantially horizontal second finger disposed in faced relationship with one another, and an substantially horizontal third finger disposed in faced relationship with one another, so as to define a magnet cavity of receiving the permanent magnet, a shunt cavity, and a yoke air gap of predetermined lateral dimension;

a variable magnetic shunt disposed in the shunt cavity and operative to rotate therein so as to perturb the magnetic field, the shunt comprised of a high permeability magnetic material and affixed to an object whose position is sought to be detected, whereby to guide at least a portion of the magnetic field across the opposing second fingers of the yoke during maximum shunt, and substantially reduce the magnetic field that crosses the shunt cavity during minimum shunt;

a magneto-resistive sensor disposed in said yoke air gap for determining the intensity of the magnetic field therein and for generating an electrical signal corresponding thereto, whereby the magnetic field in the yoke gap corresponds to the angular/linear position of the variable shunt.

* * * * *